United States Patent
Rozman et al.

(10) Patent No.: US 8,519,686 B2
(45) Date of Patent: Aug. 27, 2013

(54) SSPC FOR SOFT START OF DC LINK CAPACITOR

(75) Inventors: Gregory I. Rozman, Rockford, IL (US); Joshua C. Swenson, Rockford, IL (US); Vietson M. Nguyen, Rockford, IL (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 579 days.

(21) Appl. No.: 12/783,098

(22) Filed: May 19, 2010

(65) Prior Publication Data

US 2011/0286141 A1    Nov. 24, 2011

(51) Int. Cl.
*G05F 1/00*    (2006.01)

(52) U.S. Cl.
USPC ........... 323/282; 323/234; 323/237; 323/238; 323/265; 323/288; 361/211

(58) Field of Classification Search
USPC .................. 323/234, 237, 238, 265, 282, 288; 361/211
See application file for complete search history.

(56) References Cited

U.S. PATENT DOCUMENTS

| | | | |
|---|---|---|---|
| 6,246,559 B1 | 6/2001 | Sanders et al. | |
| 7,453,678 B2 | 11/2008 | Beneditz et al. | |
| 7,564,147 B2 | 7/2009 | Michalko | |
| 7,656,634 B2 * | 2/2010 | Robertson et al. | 361/93.7 |
| 8,232,755 B2 * | 7/2012 | Jeung | 318/400.26 |
| 8,299,762 B2 * | 10/2012 | Rozman et al. | 322/37 |
| 2003/0001552 A1 * | 1/2003 | Fujita et al. | 323/288 |
| 2006/0049793 A1 * | 3/2006 | Mayhew | 318/800 |
| 2007/0241700 A1 * | 10/2007 | Williams | 318/254 |
| 2007/0268726 A1 * | 11/2007 | Kojori et al. | 363/65 |
| 2007/0271403 A1 * | 11/2007 | Kojori | 710/302 |
| 2007/0298638 A1 * | 12/2007 | Kojori | 439/181 |
| 2009/0027028 A1 * | 1/2009 | Ting | 323/288 |
| 2009/0115379 A1 * | 5/2009 | Al-Shyoukh | 323/238 |
| 2009/0140712 A1 * | 6/2009 | Giombanco et al. | 323/288 |
| 2009/0289608 A9 * | 11/2009 | Al-Shyoukh | 323/238 |
| 2009/0295340 A1 * | 12/2009 | Kwon et al. | 323/220 |
| 2009/0315530 A1 * | 12/2009 | Baranwal | 323/288 |
| 2011/0221404 A1 * | 9/2011 | Rozman et al. | 323/234 |

(Continued)

FOREIGN PATENT DOCUMENTS

JP    10304501 A    * 11/1998

OTHER PUBLICATIONS

United Technologies Patent Application PA-0007947-US, Starting/Generating System with Multi-Functional Circuit Breaker, Filed Jun. 5, 2009, U.S. Appl. No. 12/479,211, Hamilton Sundstrand Corporation.
Semisouth, Data Sheet of SemiSouth Normally-OFF Trench Silicon Carbide Power JFET SJEP120R063, SemiSouth Labratories.

(Continued)

*Primary Examiner* — Kawing Chan
(74) *Attorney, Agent, or Firm* — Cantor Colburn LLP

(57) ABSTRACT

A solid state power controller (SSPC) for soft start of a direct current (DC) link capacitor of a DC power distribution system includes a power input connected to a DC power source of the DC power distribution system; a plurality of power switches arranged in parallel, the plurality of power switches being connected to a power output of the SSPC, the power output being connected to the DC link capacitor; and an SSPC controller configured to: pulse width modulate the plurality of power switches with a phase-shifted sequence in a current limiting mode; determine whether soft start is complete; and in response to determining that the soft start is complete, turn on the plurality of switches at a maximum gate-source voltage.

18 Claims, 5 Drawing Sheets

(56) References Cited

U.S. PATENT DOCUMENTS

| | | | |
|---|---|---|---|
| 2011/0260534 A1* | 10/2011 | Rozman et al. | 307/26 |
| 2011/0309809 A1* | 12/2011 | Rao et al. | 323/282 |
| 2012/0007425 A1* | 1/2012 | Rozman et al. | 307/25 |

OTHER PUBLICATIONS

Meux et al., Standardizing solid state electric distribution for a greener and cheaper aircraft, More Electric Aircraft Forum coordinated by Airbus France, 2009, Airbus.

* cited by examiner

400

PERFORM PHASE-SHIFTED PULSE WIDTH MODULATION OF SSPC SWITCHES AT THE CURRENT LIMIT DURING SOFT START
401

DETERMINE IF CONDITIONS ARE APPROPRIATE FOR END OF SOFT START
402

IF CONDITIONS ARE APPROPRIATE FOR END OF SOFT START, TURN ON SSPC POWER SWITCHES AT MAXIMUM GATE-SOURCE VOLTAGE
403

SSPC POWERS MOTOR CONTROLLER DURING NORMAL OPERATION
404

SSPC FOR SOFT START OF DC LINK CAPACITOR

FIELD OF INVENTION

The subject matter disclosed herein relates generally to the field of solid state power controllers.

DESCRIPTION OF RELATED ART

Solid State Power Controllers (SSPCs) are used in power distribution systems in, for example, the aerospace industry, as an alternative to traditional electromechanical circuit breakers. An SSPC may distribute power to and protect various electrical loads. In comparison to electromechanical devices, SSPCs provide relatively fast response time, and may eliminate arcing during turn-off transient and bouncing during turn-on transient. SSPCs also do not suffer severe degradation during repeated fault isolation in comparison with electromechanical devices. SSPCs may be relatively small in weight and size. SSPCs facilitate advanced protection and diagnostics, allowing for efficient power distribution architectures and packaging techniques.

U.S. patent application Ser. No. 12/479,211 (filed on Jun. 5, 2009 and assigned to Hamilton Sundstrand, which is herein incorporated by reference in its entirety) discusses an SSPC that may be used to provide circuit breaker and soft start functions in a direct current (DC) power distribution system with a DC link motor controller comprising a high-Q DC link capacitor (having a capacitance $C_{dc}$). The soft start is accomplished by pulse width modulation (PWM) of a switch in the SSPC until the voltage across the DC link capacitor reaches the near-system bus voltage. Use of the SSPC for soft start simplifies the system by eliminating separate pre-charge circuitry, and works satisfactorily when the SSPC is located within the DC link motor controller housing or in relatively close proximity to the DC link motor controller. However, if the SSPC is located, for example, within a power management unit at a distance from the DC link motor controller, the length of a feeder bus connecting the SSPC and the DC link motor controller may be substantial, resulting in a parasitic inductance ($L_{feeder-dc}$) between the SSPC and the DC load. Underdamped oscillations with a frequency determined by $L_{feeder-dc}$ and $C_{dc}$ may be introduced on the system bus during SSPC chopping, compromising power quality. The oscillations may be mitigated by adding a filter between the SSPC and system bus, or by using a passive damper between SSPC and the load, or SSPC and the system bus. These solutions, however, may add complexity, weight, and size to the DC power distribution system.

BRIEF SUMMARY

According to one aspect of the invention, a method for soft start of a direct current (DC) link capacitor of a DC power distribution system using a solid state power controller (SSPC), the SSPC comprising a plurality of power switches arranged in parallel includes pulse width modulating the plurality of power switches with a phase-shifted sequence in a current limiting mode; determining whether soft start is complete; and in response to determining that the soft start is complete, turning on the plurality of switches at a maximum gate-source voltage.

According to another aspect of the invention, a solid state power controller (SSPC) for soft start of a direct current (DC) link capacitor of a DC power distribution system includes a power input connected to a DC power source of the DC power distribution system; a plurality of power switches arranged in parallel, the plurality of power switches being connected to a power output of the SSPC, the power output being connected to the DC link capacitor; and an SSPC controller configured to: pulse width modulate the plurality of power switches with a phase-shifted sequence in a current limiting mode; determine whether soft start is complete; and in response to determining that the soft start is complete, turn on the plurality of switches at a maximum gate-source voltage.

Other aspects, features, and techniques of the invention will become more apparent from the following description taken in conjunction with the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for an SSPC for soft start of a DC link capacitor are provided, with exemplary embodiments being discussed below in detail. An SSPC may be used in a DC power distribution system for soft start of a DC link capacitor located in a DC motor controller without the need for additional passive filters or dampers, reducing the complexity, weight, and size of the DC power distribution system. The SSPC may be located in a power management unit at a distance from the DC motor controller, and connected to the DC motor controller by a feeder bus.

Figure 1:
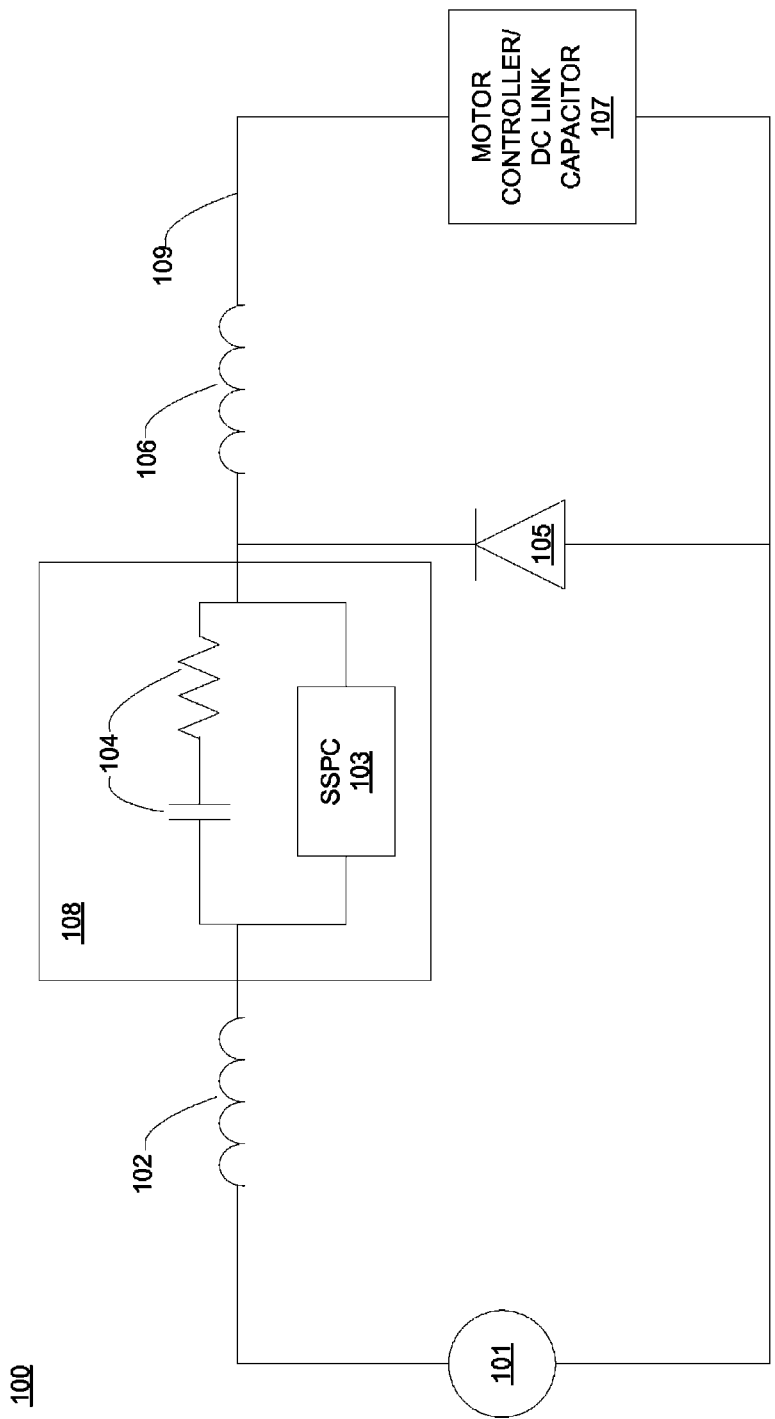
FIG. 1 illustrates an embodiment of a DC power distribution system.

FIG. 1 illustrates an embodiment of a DC power distribution system 100 comprising an SSPC 103 for soft start of a DC link capacitor located in motor controller 107. DC power source 101 powers the DC link capacitor of motor controller 107 via SSPC 103. SSPC 103 may be located in a power management unit 108 at a distance from motor controller 107 that is connected to motor controller 107 by a feeder bus 109 having a parasitic resistance represented by inductance 106. The total parasitic line inductance $L_{feeder-dc}$ in system 100 is represented by inductances 102 and 106. SSPC 103 is connected in parallel with a snubber 104, which may comprise a resistance element and a capacitance element. A voltage clamping diode 105 is connected across motor controller 107.

Figure 2:
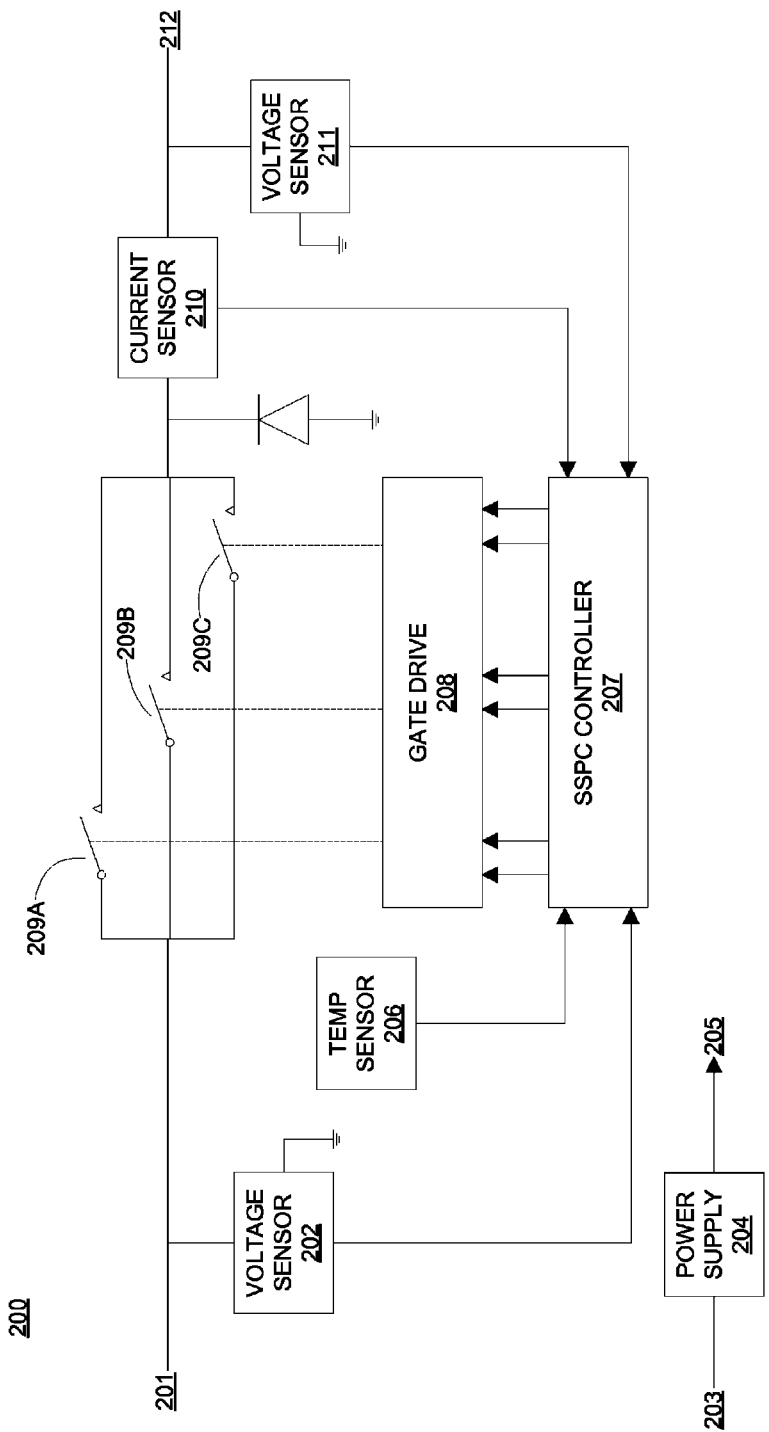
FIG. 2 illustrates an embodiment of an SSPC for soft start of a DC link capacitor.

FIG. 2 illustrates an embodiment of an SSPC 200 for soft start of a DC link capacitor, which may comprise SSPC 103 of FIG. 1. SSPC 200 receives input power at power input 201 from DC source 101 of FIG. 1, and powers motor controller 107 of FIG. 1 via parallel power switches 209A-C (which are controlled by SSPC controller 207 via gate drive 208) and power output 212. SSPC controller 207 controls the gate-source voltage ($V_{GS}$) and On/Off of parallel power switches 209A-C via gate drive 208 based on information from input voltage sensor 202, output voltage sensor 211, output current sensor 210, and temperature sensor 206. The SSPC controller 207 can be implemented using a microcontroller, gate array, and/or other circuitry. The internal modules and sensors comprising SSPC 200 are powered by DC control power input 203 via internal power supply 204 and internal power supply output 205. Parallel power switches 209A-C are shown for illustrative purposes only; SSPC 200 may comprise any appropriate number of parallel power switches.

Figure 3:
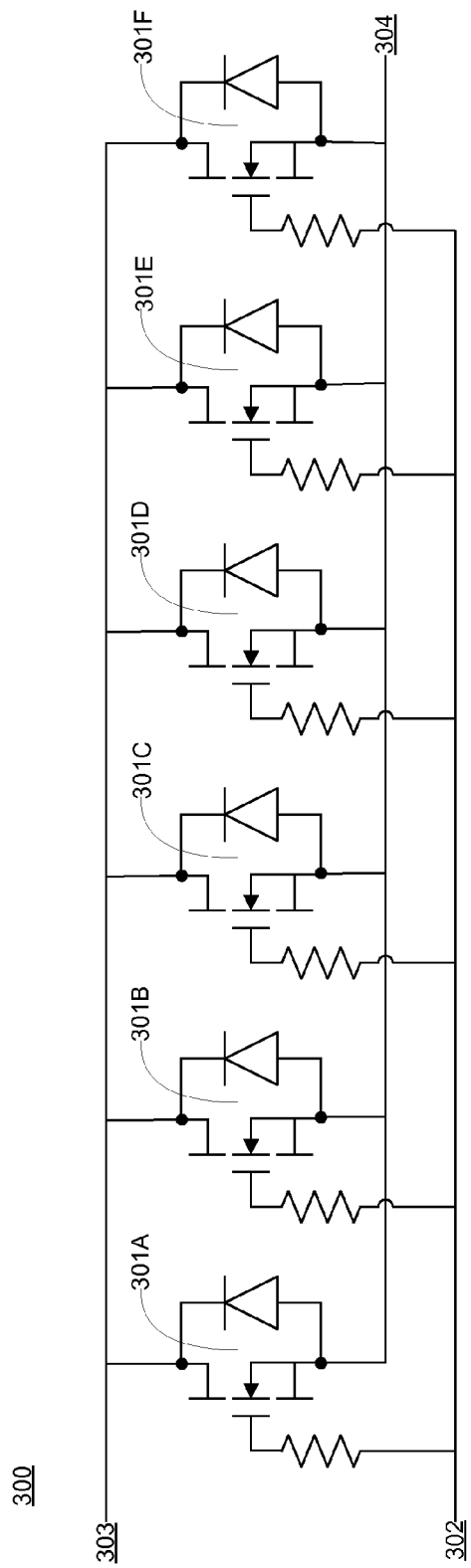
FIG. 3 illustrates an embodiment of a switch for an SSPC for soft start of a DC link capacitor.

Parallel power switches 209A-C may each comprise one or more field effect transistors (FETs); in some embodiments, the FETs may comprise silicon carbide (SiC) junction gate field effect transistors (JFETs). The number, type, and arrangement of FETs that comprise each of parallel power switches 209A-C may be determined based on various factors, such as SSPC packaging size or overall SSPC power rating, in order to enable relatively high SSPC power rating and relatively low on-resistance losses. In some embodiments, each of parallel power switches 209A-C may comprise a respective JFET group 300, comprising 6 JFETs 301A-F, arranged in parallel as shown in FIG. 3. Input 302 is connected to the $V_{GS}$ output of gate drive 208 of FIG. 2, input 303 is connected to SSPC input 201, and output 304 is connected to output 212 of SSPC 200 via current sensor 210.

Figure 4:
FIG. 4 illustrates an embodiment of a method for soft start of a DC link capacitor using an SSPC.
Figure 4:
Figure 4:
Figure 5:
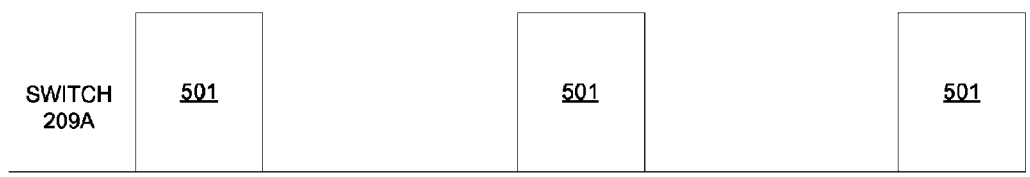
FIG. 5 illustrates a phase-shifted gate-source voltage waveform for an SSPC for soft start of a DC link capacitor.
Figure 5:
Figure 5:
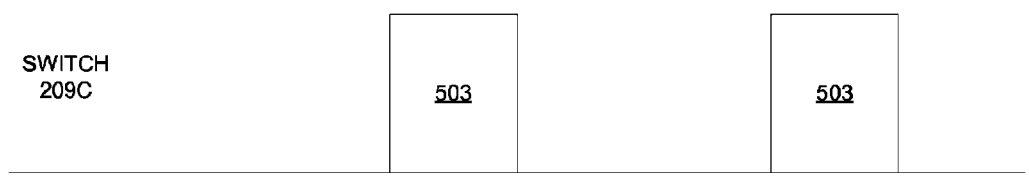

FIG. 4 illustrates an embodiment of a method 400 for soft start of a DC link capacitor using an SSPC. In block 401, during soft start, a $V_{GS}$ waveform is applied to each of parallel power switches 209A-C of FIG. 2 based on the required current limit for the DC link capacitor located in DC motor controller 107 of FIG. 1. The $V_{GS}$ waveform may be driven by the gate drive 208 in response to the SSPC controller 207 of FIG. 2. Operating the parallel power switches 209A-C in current limiting mode causes the junction temperature and drain-source on-resistance of parallel power switches 209A-C to increase. This increase in on-resistance of parallel power switches 209A-C in the SSPC (103, 200) in series with the feeder inductances 102 and 106 of FIG. 1 acts to dampen any oscillations induced in DC power distribution system 100 by parasitic $L_{feeder-dc}$ and the high-Q $C_{dc}$ of the DC link capacitor. In order to prevent overheating of switches 209A-C in current limiting mode, and to increase of the damping resistance during soft start, the $V_{GS}$ each of switches 209A-C are pulse width modulated (PWM) at the current limit with a phase-shifted sequence; for example, using a phase-shifted $V_{GS}$ waveform 500 such as is shown in FIG. 5. Waveform 500 may be applied to embodiments of SSPC 200 that comprise three parallel power switches. Waveform 501 is applied to the $V_{GS}$ of switch 209A; waveform 502 is applied to the $V_{GS}$ of switch 209B, and waveform 503 is applied to the $V_{GS}$ of switch 209C. The phase shifting of waveform 500 also acts to increase the effective PWM frequency of the SSPC (103, 200), reducing demand on snubber circuitry 104 of FIG. 1.

In block 402, the SSPC controller 207 monitors the input voltage from input voltage sensor 202, the output voltage from output voltage sensor 211, and output current from output current sensor 210 to determine the end of soft start. The end of soft start may occur when the output voltage is at or near the system bus voltage, or when the output current falls below a soft start limit current level. Open loop control may also be used. In block 403, after completion of soft start, the On/Off control of gate drive 208 is turned on, and the $V_{GS}$ for each of parallel power switches 209A-C is set to the maximum level (about 3 volts DC in some embodiments), ensuring minimum on-resistance. In block 404, the DC power source 101 and SSPC 103 power the motor controller 107 in normal operation.

The technical effects and benefits of exemplary embodiments include dampening of oscillations induced in a DC power distribution system by feeder inductance during soft start.

The terminology used herein is for the purpose of describing particular embodiments only and is not intended to be limiting of the invention. While the description of the present invention has been presented for purposes of illustration and description, it is not intended to be exhaustive or limited to the invention in the form disclosed. Many modifications, variations, alterations, substitutions, or equivalent arrangement not hereto described will be apparent to those of ordinary skill in the art without departing from the scope and spirit of the invention. Additionally, while various embodiment of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method for soft start of a direct current (DC) link capacitor of a DC power distribution system using a solid state power controller (SSPC), the SSPC comprising a plurality of power switches arranged in parallel, the method comprising:
    pulse width modulating the plurality of power switches with a phase-shifted sequence in a current limiting mode;
    determining whether soft start is complete; and
    in response to determining that the soft start is complete, turning on the plurality of switches at a maximum gate-source voltage.

2. The method of claim 1, wherein the plurality of power switches comprises 3 power switches arranged in parallel.

3. The method of claim 1, wherein the plurality of power switches comprise silicon carbide (SiC) junction gate field effect transistors (JFETs).

4. The method of claim 3, wherein each of the plurality of power switches comprises 6 SiC JFETs arranged in parallel.

5. The method of claim 1, wherein determining whether soft start is complete comprises determining whether an output voltage of the SSPC is at a system bus voltage for the DC power distribution system.

6. The method of claim 1, wherein determining whether soft start is complete comprises determining whether an output current of the SSPC is below a soft start limit current level.

7. The method of claim 1, wherein the DC link capacitor is located in a DC motor controller of the DC power distribution system, and the SSPC is located in a power management unit connected to the DC motor controller by a feeder bus.

8. The method of claim 1, wherein pulse width modulating the plurality of parallel power switches with a phase-shifted sequence comprises:
    turning on a first switch of the plurality of parallel power switches, wherein a second switch of the plurality of parallel power switches and a third switch of the plurality of parallel power switches are off while the first switch of the plurality of parallel power switches is on;
    simultaneously turning off the first switch of the plurality of parallel power switches and turning on the second switch of the plurality of parallel power switches, wherein the first switch of the plurality of parallel power switches and the third switch of the plurality of parallel power switches are off while the second switch of the plurality of parallel power switches is on; and
    simultaneously turning off the second switch of the plurality of parallel power switches and turning on the third switch of the plurality of parallel power switches, wherein the first switch of the plurality of parallel power switches and the second switch of the plurality of parallel power switches are off while the third switch of the plurality of parallel power switches is on.

9. A solid state power controller (SSPC) for soft start of a direct current (DC) link capacitor of a DC power distribution system, comprising:
a power input connected to a DC power source of the DC power distribution system;
a plurality of power switches arranged in parallel, the plurality of power switches being connected to a power output of the SSPC, the power output being connected to the DC link capacitor; and
an SSPC controller configured to:
pulse width modulate the plurality of power switches with a phase-shifted sequence in a current limiting mode;
determine whether soft start is complete; and
in response to determining that the soft start is complete, turn on the plurality of switches at a maximum gate-source voltage.

10. The SSPC of claim 9, wherein the plurality of power switches comprises 3 power switches arranged in parallel.

11. The SSPC of claim 9, wherein the plurality of power switches comprise silicon carbide (SiC) junction gate field effect transistors (JFETs).

12. The SSPC of claim 11, wherein each of the plurality of power switches comprises 6 SiC JFETs arranged in parallel.

13. The SSPC of claim 9, wherein the SSPC controller is configured to determine that soft start is complete in the event an output voltage of the SSPC is at a system bus voltage for the DC power distribution system.

14. The SSPC of claim 9, wherein the SSPC controller is configured to determine that soft start is complete in the event an output current of the SSPC is below a soft start limit current level.

15. The SSPC of claim 9, wherein the DC link capacitor is located in a DC motor controller of the DC power distribution system, and the SSPC is located in a power management unit connected to the DC motor controller by a feeder bus.

16. The SSPC of claim 9, wherein pulse width modulating the plurality of parallel power switches with a phase-shifted sequence comprises:
turning on a first switch of the plurality of parallel power switches, wherein a second switch of the plurality of parallel power switches and a third switch of the plurality of parallel power switches are off while the first switch of the plurality of parallel power switches is on;
simultaneously turning off the first switch of the plurality of parallel power switches and turning on the second switch of the plurality of parallel power switches, wherein the first switch of the plurality of parallel power switches and the third switch of the plurality of parallel power switches are off while the second switch of the plurality of parallel power switches is on; and
simultaneously turning off the second switch of the plurality of parallel power switches and turning on the third switch of the plurality of parallel power switches, wherein the first switch of the plurality of parallel power switches and the second switch of the plurality of parallel power switches are off while the third switch of the plurality of parallel power switches is on.

17. A solid state power controller (SSPC) for soft start of a direct current (DC) link capacitor of a DC power distribution system, comprising:
a power input of the SSPC connected to a DC power source of the DC power distribution system;
a power output of the SSPC connected to the DC link capacitor;
a plurality of parallel power switches located between the power input of the SSPC and the power output of the SSPC, wherein a switch input of each of the plurality of parallel power switches is connected to the power input of the SSPC, and a switch output of each of the plurality of power switches is connected to the power output of the SSPC;
a gate drive connected to a gate of each of the plurality of parallel switches; and
an SSPC controller connected to the gate drive, the SSPC controller configured to:
based on soft start being enabled, pulse width modulate the plurality of parallel power switches with a phase-shifted sequence in a current limiting mode via the gate drive;
determine that soft start is complete;
based on determining that the soft start is complete, turn on the plurality of parallel power switches at a maximum gate-source voltage via the gate drive; and
supply power to the power output of the SSPC via the plurality of parallel power switches.

18. The SSPC of claim 17, wherein pulse width modulating the plurality of parallel power switches with a phase-shifted sequence comprises:
turning on a first switch of the plurality of parallel power switches, wherein a second switch of the plurality of parallel power switches and a third switch of the plurality of parallel power switches are off while the first switch of the plurality of parallel power switches is on;
simultaneously turning off the first switch of the plurality of parallel power switches and turning on the second switch of the plurality of parallel power switches, wherein the first switch of the plurality of parallel power switches and the third switch of the plurality of parallel power switches are off while the second switch of the plurality of parallel power switches is on; and
simultaneously turning off the second switch of the plurality of parallel power switches and turning on the third switch of the plurality of parallel power switches, wherein the first switch of the plurality of parallel power switches and the second switch of the plurality of parallel power switches are off while the third switch of the plurality of parallel power switches is on.

\* \* \* \* \*